United States Patent [19]

Bowers et al.

[11] Patent Number: 4,677,369

[45] Date of Patent: Jun. 30, 1987

[54] CMOS TEMPERATURE INSENSITIVE VOLTAGE REFERENCE

[75] Inventors: Derek F. Bowers, Sunnyvale; Ali Tasdighi, San Jose, both of Calif.

[73] Assignee: Precision Monolithics, Inc., Santa Clara, Calif.

[21] Appl. No.: 778,444

[22] Filed: Sep. 19, 1985

[51] Int. Cl.[4] ........................ H03K 3/26; H01L 29/90; H01L 27/02; G05F 3/16

[52] U.S. Cl. .................................... 323/314; 323/907; 307/310; 307/297; 357/13; 357/42

[58] Field of Search ................... 307/296 R, 297, 310; 323/313, 314, 315, 316, 907, 231; 357/13, 42

[56] References Cited

U.S. PATENT DOCUMENTS

| | | | |
|---|---|---|---|
| 3,829,717 | 8/1974 | Harrison | 307/310 |
| 3,916,508 | 11/1975 | Conzelmann et al. | 323/231 |
| 4,213,806 | 7/1980 | Tsang | 357/13 |
| 4,260,946 | 4/1981 | Wheatley | 323/314 |
| 4,313,083 | 1/1982 | Gilbert et al. | 323/313 |
| 4,477,737 | 10/1984 | Ulmer et al. | 323/316 |
| 4,562,400 | 12/1985 | Narasimhan | 323/231 |

OTHER PUBLICATIONS

J. Naylor, "Complete 16-Bit DAC Squeezes Onto a Single Chip", Electronic Design, Mar. 17, 1983, pp. 143-148.

Yannis P. Tsividis, "A CMOS Reference Voltage Source", IEEE International Solid-State Circuits Conference Digest of Technical Papers, Feb. 15-17, 1978, pp. 48-49.

Bang-Sup Song et al., "A Precision Curvature Compensated CMOS Bandgap Reference", IEEE International Solid-State Circuits Conference, Feb. 25, 1983, pp. 240-241.

Marc G. R. Degrauwe et al., "A Family of CMOS Compatible Bandgap References", IEEE International Solid-State Circuits Conference, Feb. 14, 1985, pp. 142-143.

Robert A. Blauschild et al., "An NMOS Voltage Reference", IEEE International Solid-State Circuits Conference Digest of Technical Papers, Feb. 15-17, 1978, pp. 50-51.

*Primary Examiner*—Stanley D. Miller
*Assistant Examiner*—Trong Quang Phan
*Attorney, Agent, or Firm*—Koppel & Harris

[57] ABSTRACT

A temperature insensitive voltage reference is described which can advantageously be implemented using standard CMOS processing techniques. A pair of parasitic bipolar transistors are coupled with appropriate resistors to produce a voltage with a temperature coefficient that is equal in value but of opposite polarity to a zener diode voltage-temperature coefficient. This voltage is then combined with a zener diode voltage to yield the desired output reference voltage.

8 Claims, 5 Drawing Figures

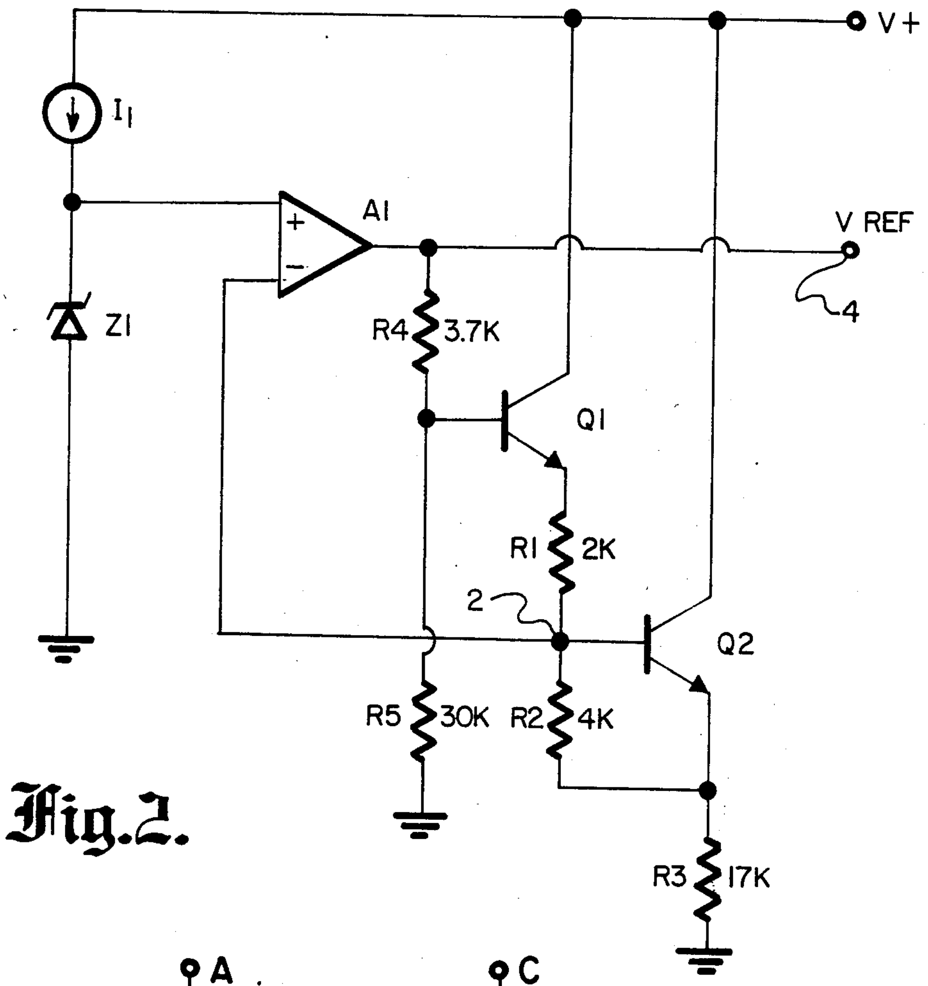
Fig.2.
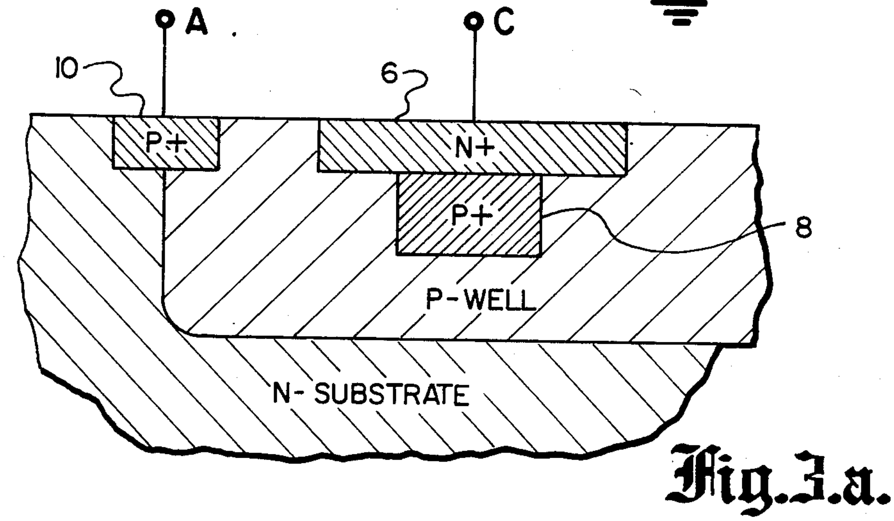
Fig.3.a.

CMOS TEMPERATURE INSENSITIVE VOLTAGE REFERENCE

BACKGROUND OF THE INVENTION

1. Field of the Invention

This invention relates to integrated circuit voltage references, and more particularly to zener diode voltage references capable of being implemented with CMOS (complementary metal oxide semiconductor) processing techniques.

2. Description of the Prior Art

Voltage references are required to provide a substantially constant output voltage irrespective of changes in input voltage, output current or temperature. Such references are used in many design applications, such as stable current references, multipliers, control circuits, portable meters, two-terminal references and process controllers.

It would be desirable to have better voltage references for devices formed with a CMOS process. The benefits of CMOS for both analog-to-digital (A/D) and digital-to-analog converter (DAC) products have resulted in their use in many new designs. The processing for these circuits must solve linear high-accuracy problems as well as provide high densities for the required digital-logic circuits. Unfortunately, the development of voltage references which use CMOS processing and are relatively insensitive to temperature changes has not kept up with other CMOS developments.

Modern voltage references are generally based on either zener diodes or bandgap generated voltages. When implemented in CMOS, bandgap voltage references have been found to require relatively complicated designs, generally including at least two operational amplifiers. While zener reference circuits are simpler in design, they generally require the use of other diodes that are not available with CMOS processing. Parasitic bipolar transistors can be achieved with CMOS, but they have not been found to be capable of effective use as diodes.

SUMMARY OF THE INVENTION

In view of the above problems associated with the prior art, the object of the present invention is the provision of a novel and improved zener diode type voltage reference which is substantially insensitive to temperature variations, can be implemented using a standard CMOS process, and is simple in design.

In the accomplishment of this object, a zener diode having a voltage-temperature coefficient (tempco) whose approximate value is known is implemented with a CMOS process and maintained in a reverse biased breakdown state. A first resistor is connected in circuit with the emitter of a first parasitic bipolar transistor (for an npn implementation), with the other end of the resistor coupled to the zener diode to establish a tempco at the resistor which tracks the zener tempco. The bipolar transistor has a base-emitter tempco which is of opposite polarity and smaller absolute value than the zener tempco. A current is established through the first resistor and the emitter circuit of the first transistor, the value of the current being sufficient to produce a voltage across the resistor and transistor base-emitter circuit which has a cumulative tempco of opposite polarity and substantially equal absolute value fo the zener tempco. The two tempcos thereby balance out, leaving a voltage at the base of the transistor which is substantially temperature insensitive. An output terminal is connected in circuit with the transistor base to receive a scaled up output voltage which is similarly substantially temperature insensitive.

In a preferred embodiment the desired current through the first resistor and first transistor emitter is established by means of a second parasitic bipolar transistor that has its base connected to the first resistor. A second resistor is connected across the base-emitter terminals of the second transistor, and is thus in series with the first resistor. The resistance values of the first and second resistors are proportioned to set up the desired current through the first resistor which is necessary to establish the output reference voltage at a temperature compensated level. The zener diode is preferably coupled to the first resistor and to the base of the second transistor by means of an operational amplifier. The amplifier has one input connected to the zener diode, and its other input connected to the first resistor and the base of the second transistor. Through the inherent action of the operational amplifier in equalizing the voltage levels at its two inputs, the voltage at its other input tracks the zener voltage except for negligible amplifier input offsets. The zener voltage with its positive tempco is thus established at one end of the first transistor-first resistor network, with the negative tempco of that network being added prior to reaching the output terminal. Since the circuit values are selected so that the two tempcos balance each other, a high precision reference voltage output is achieved. A voltage divider circuit can be connected between the output terminal and the base of the first transistor to set the output reference voltage at a desired multiple of the transistor base voltage.

These and other objects and features of the invention will be apparent to those skilled in the art from the following detailed description of preferred embodiments, taken together with the accompanying drawings, in which:

DESCRIPTION OF THE DRAWINGS

FIG. 2 is a schematic diagram of a preferred embodiment of the present invention;

FIGS. *3a* and *3b* illustrate alternate methods of implementing a zener diode with a CMOS process.

DETAILED DESCRIPTION OF PREFERRED EMBODIMENTS

Figure 1:
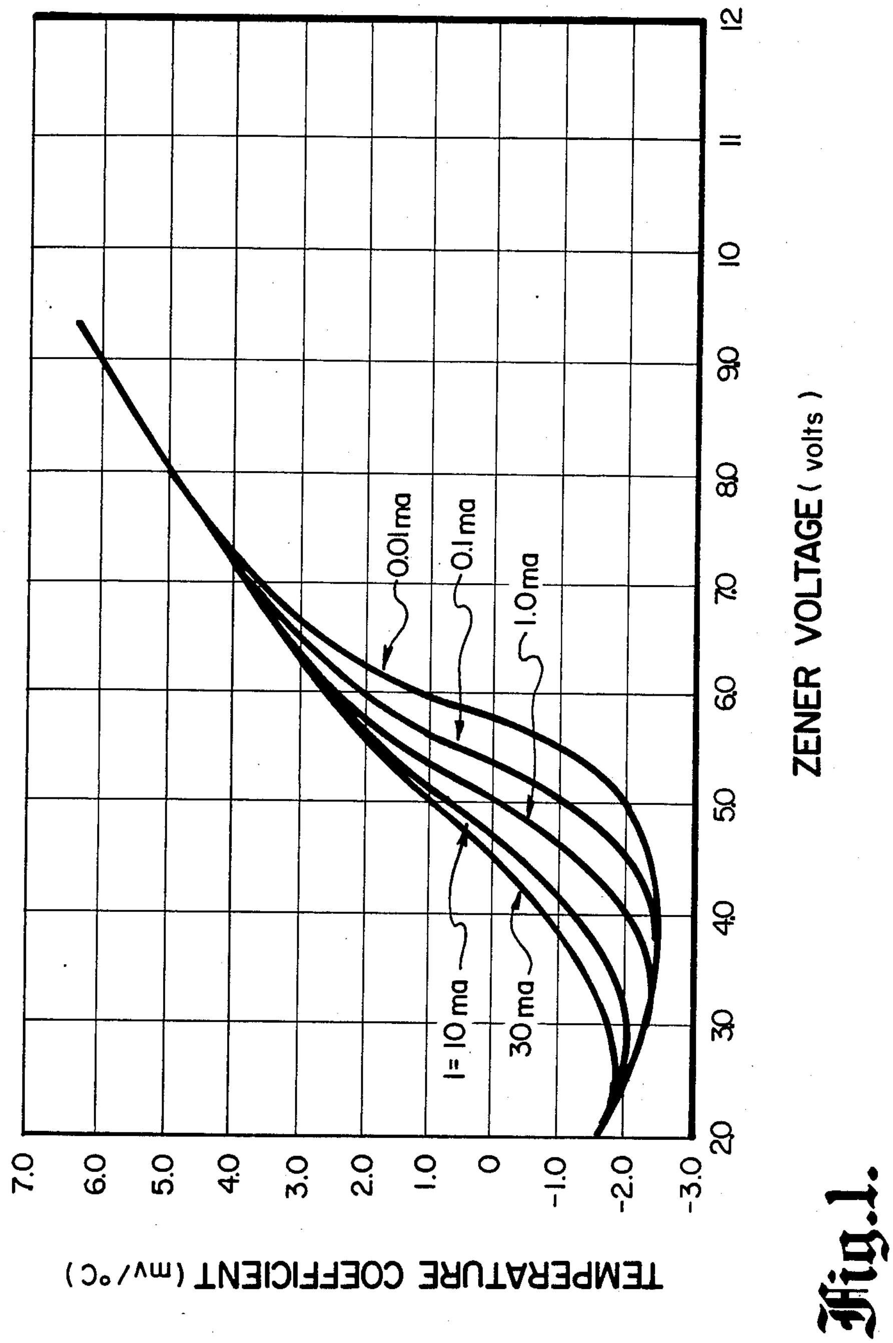
FIG. 1 is a graph showing breakdown zener diode temperature coefficients as a function of current and breakdown voltage.

The present invention achieves a temperature insensitive CMOS reference voltage by compensating the positive tempco of a zener diode with an appropriate number of forward-biased junctions that simulate diodes with negative temperature coefficients. A typical temperature coefficient pattern for a zener diode as a function of current and breakdown voltage is illustrated in FIG. 1. Depending upon the current through the zener, its tempco will be positive when its breakdown voltage is in excess of about 5 volts. When implemented with a CMOS process, the zener breakdown voltage is typically in the range of about 6–8 volts, with a corresponding tempco of approximately 3 mV/° C. The present invention uses parasitic bipolar transistors that are available with CMOS processing to simulate the effects of standard diodes with negative tempcos, and uses these devices to compensate for the positive zener tempco, yielding a substantially temperature insensitive output.

Referring now to FIG. 2, a schematic diagram of preferred circuitry is shown. A zener diode Z1 has its anode connected to ground or other suitable voltage reference point, and its cathode connected to the non-inverting input of an operational amplifier A1. A current source I1 is connected to a positive voltage bus V+, typically set at +15 volts, and delivers a current flow to the zener diode sufficient to maintain it in a reverse-biased breakdown state at which the voltage across the zener is approximately constant. Alternately, the zener diode could be provided with a breakdown current from a resistor connected between its cathode and the amplifier output.

A first transistor-resistor network which simulates the operation of a diode comprises a parasitic bipolar transistor Q1 and a resistor R1 connected to its emitter. Q1 may be obtained with a standard CMOS process, as explained hereinafter. The opposite end of R1 is connected to the base of a second parasitic bipolar transistor Q2. A second resistor R2 is connected between the base-emitter terminals of Q2, with a further resistor R3 connected between the emitter of Q2 and ground reference to maintain Q2 conductive. The collectors of both transistors Q1 and Q2 are connected to V+, as required by the CMOS process.

The inverting input of amplifier A1 is connected to node 2 between the base of Q2 and the opposite end of R1 from Q1. By virtue of the inherent operating characteristics of an operational amplifier, which acts to equalize the voltages at its two inputs, this connection causes the voltage at node 2 to track the voltage across zener diode Z1. There will generally be some input offset voltage at the amplifier which causes imperfect tracking, but this factor is negligible in the present circuit, and in any event can be substantially eliminated by resistor trimming.

A reference output terminal 4 is connected to the amplifier output. A voltage divider circuit consisting of series connected resistors R4 and R5 is connected between output terminal 4 and a ground reference, with the base of transistor Q1 connected to an intermediate node between R4 and R5. The voltage divider circuit acts to increase a temperature-stable voltage established at the base of Q1 by a desired multiple, as determined by the relative resistive values of R4 and R5. The resulting output reference voltage at terminal 4 is both temperature insensitive and set at a desired reference level.

The operation of the circuit may be explained with reference to the resistance values given in FIG. 1, which are illustrative only and may be considerably varied. The temperature coefficients of parasitic bipolar transistors Q1 and Q2 are each typically about −2 mV/° C., or about two-thirds the absolute value of the zener diode tempco and of opposite polarity thereto. Since R2 is connected directly across the base-emitter terminals of Q2, the voltage across R2 will be equal to the base-emitter voltage of Q2, which is typically about 0.6 volts. The R2 voltage establishes a current through R2 which draws an equal current through R1 (ignoring the small base current of Q2 and any current contribution from the inverting input of A1). Since the resistance value of R2 is twice that of R1 in this example, the voltage established across R1 will be approximately half of the transistor baseemitter voltage. Continuing up through the base-emitter circuit of Q1, another base-emitter drop of about 0.6 volts is encountered, producing a total voltage drop from the base of Q1 to node 2 at the opposite end of R1 of about 1.5 times the bipolar transistor base-emitter drop.

It should be recalled that the Q1 tempco is about two-thirds that of the zener diode tempco, and of opposite polarity. Since the voltage across R1 is established by the R1/R2 ratio of half the base-emitter voltage of Q2, the R1 voltage will exhibit a tempco equal to about half the transistor tempco, or about one-third the zener diode tempco. Adding up the cumulative tempcos across R1 and the base-emitter circuit of Q1, a net tempco equal to about 1.5 times the bipolar transistor tempco, or about −3.0 mV/° C., results, This, however, is equal in absolute value to the zener diode tempco. Since node 2 tracks the zener voltage, and thereby the zener tempco, the positive zener tempco at node 2 is balanced out by the negative 1.5 bipolar transistor tempco across R1 and the base-emitter of Q1 to yield a voltage at the base of Q1 which is substantially temperature insensitive. With a typical zener voltage of about 7.6 volts, the voltage at the base of Q1 will be about 8.5 volts. The voltage divider R4/R5 raises this to a level of about 10 volts at output terminal 4, which is the desired value for a typical V° of 15 volts.

Due to standard processing variations, the fact that the zener diode breakdown voltage cannot be exactly predicted in advance, and the effect of ignoring minor variables such as the amplifier input voltage offset and transistor base currents, it is unlikely that the circuit will produce a perfectly temperature compensated output voltage when first manufactured. However, the various resistors are easily trimmable, such as by laser trimming techniques, and the circuit can thus be adjusted to yield the desired degree of temperature insensitivity.

Figure 3B:
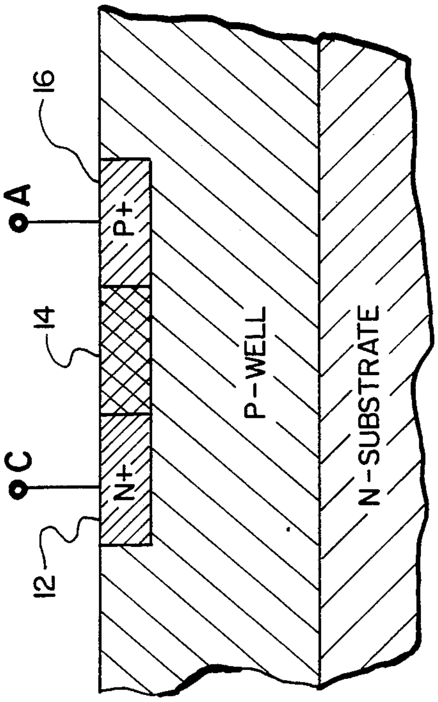

A basic form of a buried zener diode using CMOS processing is disclosed in U.S. Pat. No. 4,213,806 to Tsang and assigned to Analog Devices, Inc. Alternate ways to implement a parasitic zener diode with CMOS processing are illustrated in FIGS. 3*a* and 3*b*, which are not to scale. FIG. 3*a* illustrates a sub-surface approach in which an effective zener junction is obtained at the junction between a surface n+ section 6 and a sub-surface p+ section 8 formed below section 6. A cathode connection is made to section 6, while the anode connection is made to sub-surface section 8 via a surface p+ section 10 and the intervening p-well between sections 8 and 10. A sub-surface implementation has the advantage of being relatively noise-free, but it difficult to implement.

A surface implementation of a parasitic zener diode using CMOS processing is illustrated in FIG. 3*b*. In this example an n+ surface section 12 is overlapped in region 14 with a p+ surface section 16. The zener action occurs principally at the surface of overlap region 14, with the n+ section 12 providing a cathode connection and the p+ section 16 providing an anode connection.

Figure 4:
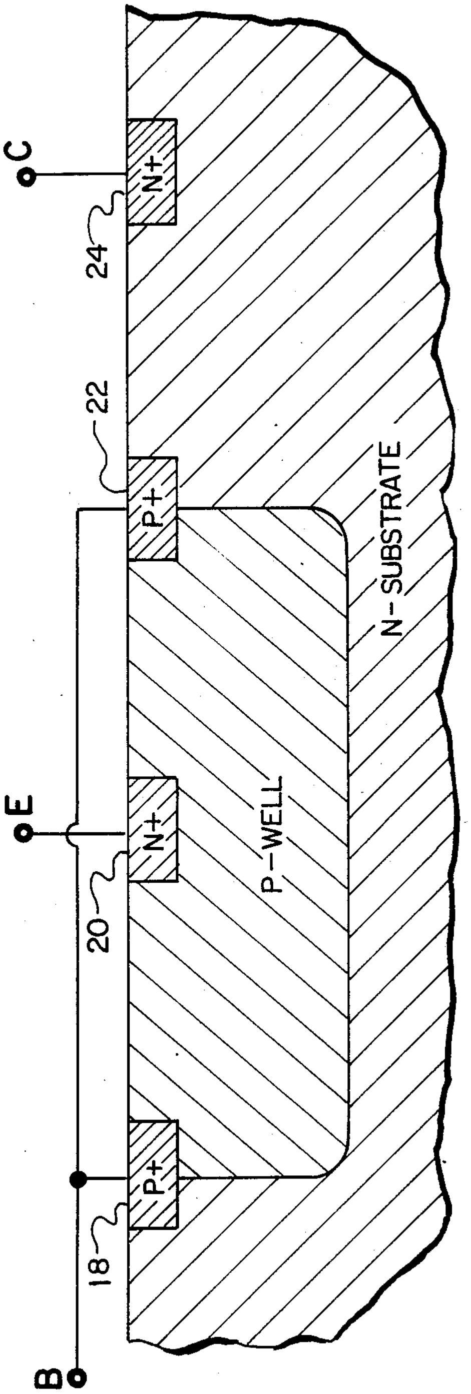
FIG. 4 illustrates a method of implementing a bipolar transistor with a CMOS process.

FIG. 4 illustrates a CMOS implementation of a parasitic bipolar transistor. Spaced along the surface of the substrate in succession are a p section 18, n section 20, pg+ section 22 and n+ section 24. A base connection is made to the p+ sections, while an emitter connection is made to the n+ section 20 and a collector connection to the n+ section 24.

It is an important advantage of the present invention that the described temperature insensitive voltage reference can be fabricated using standard CMOS processing techniques. While particular embodiments of the invention have been shown and described, numerous variations and alternate embodiments will occur to those skilled in the art. For example, the circuit of FIG. 2 is shown with parasitic npn bipolar transistors; the polarities of the transistors could be reversed and appropriate adjustments made to the circuit in an equivalent implementation which does not depart from the scope of the invention. Accordingly, it is intended that the invention be limited only in terms of the appended claims.

We claim:

1. A temperature compensated CMOS process voltage reference circuit, comprising:

- a two-terminal zener diode having first and second terminals and a voltage-temperature coefficient (tempco), the approximate value of which is known,
- a current source connected to the first terminal of the zener diode to maintain a breakdown current through the zener diode,
- a voltage reference connected to the second zener diode terminal,
- a voltage bus,
- a first bipolar transistor having a base-emitter tempco which is of opposite polarity and smaller absolute value than the zener diode tempco, and its collector connected in circuit with the voltage bus,
- a first resistor connected in series with the first transistor emitter, the first resistor having first and second terminals, the first terminal being connected to the first transistor emitter,
- voltage tracking means coupling said first zener diode terminal with said second terminal of the first resistor to establish a voltage at said second terminal of the first resistor which tracks the first zener diode terminal voltage, thereby causing the tempco at said second terminal of the first resistor to track the first zener diode terminal tempco,
- means connected to said second terminal of the first resistor for establishing a current through the series connected first resistor and first transistor emitter circuit sufficient to produce a cumulative voltage across the first resistor and first transistor base-emitter circuit which has a cumulative tempco of opposite polarity and substantially equal absolute value to the zener diode tempco, thereby establishing the voltage at the base of the first transistor at a substantially temperature insensitive level, and
- an output terminal connected in circuit with the first transistor base to receive a substantially temperature insensitive output voltage.

2. The voltage reference circuit of claim 1, the current establishing means comprising a second bipolar transistor having its collector connected in circuit with the voltage bus, its base connected to the second resistor terminal, and its emitter connected in circuit with a voltage reference to transmit a current sufficient to keep said second bipolar transistor in a conductive state, and a second resistor connected across the base-emitter terminals of said second bipolar transistor, the second resistor drawing a current through the first resistor as determined by the base-emitter voltage of said second bipolar transistor and the resistance value of the second resistor, the resistance values of the first and second resistors being proportioned to establish the desired current level through the first resistor.

3. The voltage reference circuit of claim 1, the means coupling the first zener diode terminal with said second terminal of the first resistor comprising an operational amplifier having one input connected to the first zener diode terminal and its other input connected to the second terminal of the first resistor.

4. The voltage reference circuit of claim 3, wherein the output of the operational amplifier is connected to the voltage reference output terminal.

5. The voltage reference circuit of claim 1, wherein the output terminal is connected by a resistive voltage divider circuit to the base of said first bipolar transistor, the voltage divider circuit maintaining the voltage at the output terminal in substantially constant proportion to said first bipolar transistor base voltage.

6. A temperature compensated CMOS-process voltage reference circuit, comprising:

- A two-terminal zener diode having a voltage-temperature coefficient (tempco) the approximate value of which is known,
- a current source connected to one terminal of the zener diode to maintain a breakdown current through the zener diode,
- a voltage reference connected to the other zener diode terminal,
- a voltage bus,
- first and second bipolar transistors each having baseemitter tempcos which are of opposite polarity and smaller absolute values than the zener diode tempco, and their collectors connected in circuit with the voltage bus,
- a first resistor connected between the emitter of said first bipolar transistor and the base of said second bipolar transistor,
- a second resistor connected between the base and emitter of said second bipolar transistor,
- an operational amplifier having one input connected to said one terminal of the zener diode to receive the zener diode voltage and its other input connected to the base of said second bipolar transistor, whereby the second bipolar transistor base voltage tracks the zener diode voltage,
- the resistive values of the first and second resistors being selected such that the cumulative tempco between the bases of said first and second bipolar transistors is substantially equal in absolute value but of opposite polarity to the zener diode tempco at the base of said second bipolar transistor, whereby the net voltage at the base of said first bipolar transistor is substantially insensitive to temperature, and
- an output terminal of said operational amplifier connected in circuit with said first bipolar transistor base to receive a substantially temperature insensitive voltage.

7. The voltage reference circuit of claim 6, wherein the output terminal of said operational amplifier is connected in circuit with said first bipolar transistor base by a voltage divider circuit comprising a third resistor connected between the output terminal of said operational amplifier and said first bipolar transistor base, and a fourth resistor connected between said first bipolar transistor base and a voltage reference, the resistive values of the third and fourth resistors being selected to produce a voltage at the output terminal of said operation amplifier which is a predetermined multiple of the first bipolar transistor base voltage.

8. The voltage reference circuit of claim 6, wherein the output of the operational amplifier is connected to the voltage reference output terminal.

* * * * *